(12) United States Patent
Lin et al.

(10) Patent No.: US 6,326,660 B1
(45) Date of Patent: Dec. 4, 2001

(54) METHOD TO IMPROVE THE CAPACITY OF DATA RETENTION AND INCREASE THE COUPLING RATIO OF SOURCE TO FLOATING GATE IN SPLIT-GATE FLASH

(75) Inventors: Yai-Fen Lin, Taichung; Chia-Ta Hsieh, Tainan; Hung-Cheng Sung, Hsinchu; Chuang-Ke Yeh, Hsin-Chu; Di-Son Kuo, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/524,522

(22) Filed: Mar. 13, 2000

Related U.S. Application Data

(62) Division of application No. 09/100,691, filed on Jun. 19, 1998, now Pat. No. 6,046,086.

(51) Int. Cl.$^7$ .................................................... H01L 29/76
(52) U.S. Cl. .......................... 257/314; 257/315; 257/321; 257/323
(58) Field of Search ................................... 257/314, 315, 257/321, 323

(56) References Cited

U.S. PATENT DOCUMENTS

| | | | |
|---|---|---|---|
| 5,427,968 | 6/1995 | Hong | ........................................ 437/43 |
| 5,569,945 | 10/1996 | Hong | ..................................... 257/316 |
| 5,592,002 | 1/1997 | Kanamori | ............................. 257/321 |
| 5,640,032 | * 6/1997 | Tomioka | ............................... 257/316 |
| 5,716,865 | 2/1998 | Ahn | ......................................... 437/43 |
| 5,874,759 | * 2/1999 | Park | ...................................... 257/314 |
| 5,898,197 | * 4/1999 | Fujimara | ............................... 257/317 |
| 6,136,648 | * 10/2000 | Oya | ........................................ 438/257 |
| 6,180,977 | * 1/2001 | Fujimara | ............................... 257/314 |

* cited by examiner

Primary Examiner—Jerome Jackson, Jr.
Assistant Examiner—Edgardo Ortiz
(74) Attorney, Agent, or Firm—George O. Saile; Stephen B. Ackerman; Sergin Oktay

(57) ABSTRACT

A method is provided for forming a split-gate flash memory cell having reduced size, increased capacitive coupling and improved data retention capability. A split gate cell is also provided with appropriate gate oxide thicknesses between the substrate and the floating gate and between the float gate and the control gate along with an extra thin nitride layer formed judiciously over the primary gate oxide layer in order to overcome the problems of low data retention capacity of the floating gate and the reduced capacitive coupling between the floating gate and the source of prior art.

5 Claims, 3 Drawing Sheets

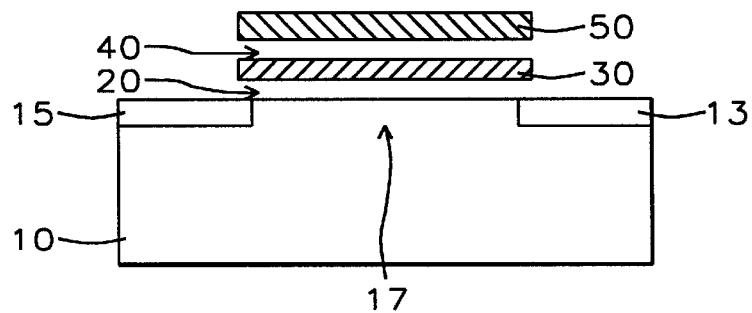
FIG. 1A - Prior Art
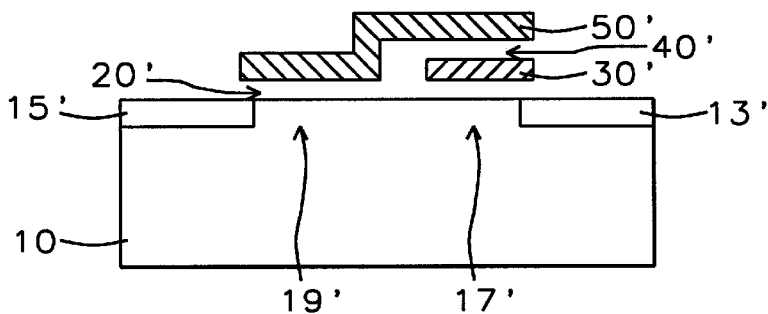
FIG. 1B - Prior Art
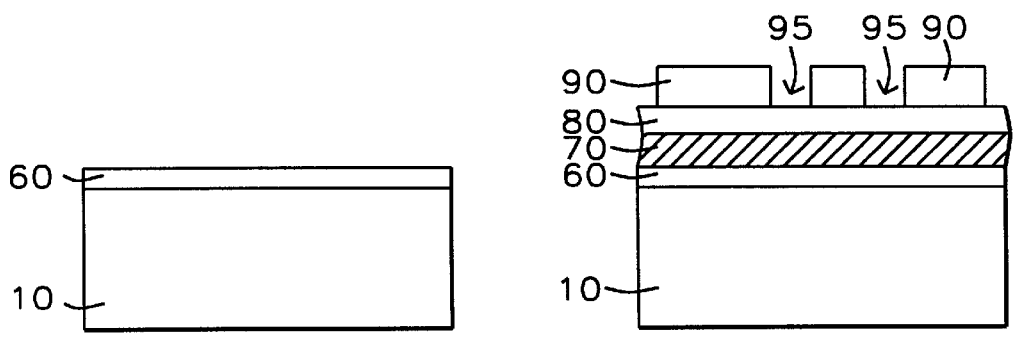
FIG. 2A - Prior Art        FIG. 2B - Prior Art

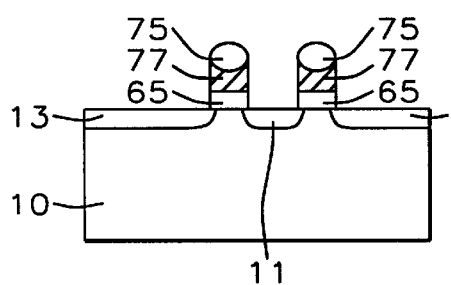
FIG. 2C –
Prior Art
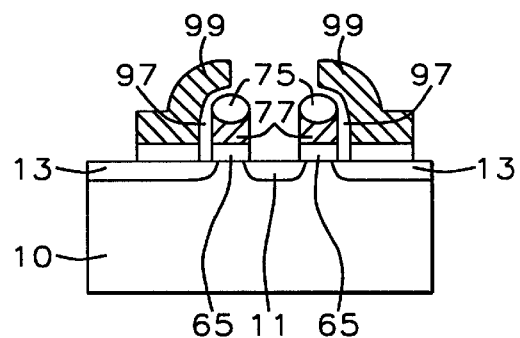
FIG. 2D –
Prior Art
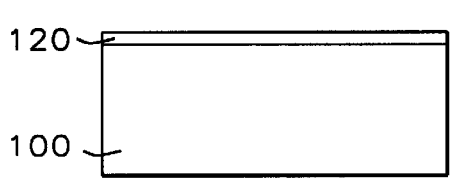
FIG. 3A
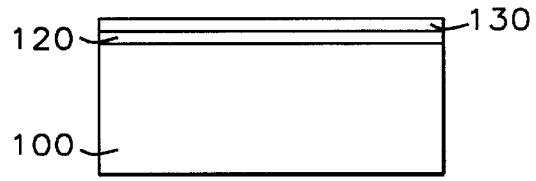
FIG. 3B
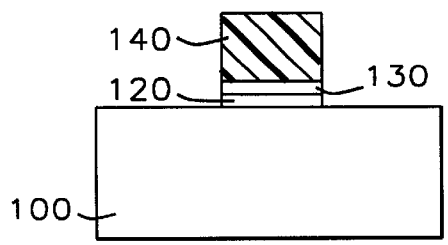
FIG. 3C
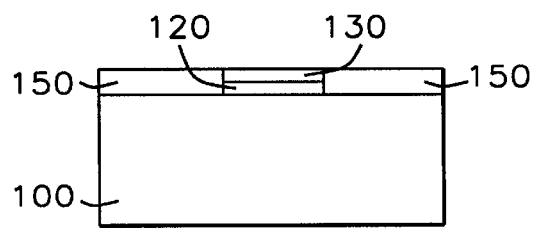
FIG. 3D

US 6,326,660 B1

METHOD TO IMPROVE THE CAPACITY OF DATA RETENTION AND INCREASE THE COUPLING RATIO OF SOURCE TO FLOATING GATE IN SPLIT-GATE FLASH

This is a division of patent application Ser. No. 09/100,691, U.S. Pat. No. 6,046,086 filing date Jun. 19, 1998, A Method To Improve The Capacity Of Data Retention And Increase The Coupling Ratio Of Source To Floating Gate In Split-Gate Flash, assigned to the same assignee as the present invention.

BACKGROUND OF THE INVENTION (1) Field of the Invention

The present invention relates to the manufacturing of semiconductor memories, and in particular, to forming split-gate flash memories with improved data retention capacity and increased coupling ratio between the source and the floating gate of the memory cell.

(2) Description of the Related Art

The importance of data retention capacity and the coupling between the gate and the source of a memory cell has been well recognized since the advent of the one-transistor cell memory cell with one capacitor. over the years, many variations of this simple cell have been advanced for the purposes of shrinking the size of the cell and, at the same time, improve its performance. The variations consist of different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMs). Generally, flash EEPROM cells having both functions of electrical programming and erasing may be classified into two categories, namely, a stack-gate structure and a split-gate structure. A conventional stack-gate type cell is shown in FIG. 1a where, as is well known, tunnel oxide film (20), a floating gate (30), an interpoly insulating film (40) and a control gate (50) are sequentially stacked on a silicon substrate (10) between a drain region (13) and a source region (15) separated by channel region (17). Substrate (10) and channel region (17) are of a first conductivity type, and the first (13) and second (15) doped regions are of a second conductivity type that is opposite the first conductivity type.

One of the problems that is encountered in flash memories is the "over-erasure" of the memory cell contents during erasure operations. As seen in FIG. 1a, the stacked-gate transistor is capable of injecting electrons from drain (13), based on a phenomenon known as the Fowler-Nordheim Tunneling Effect, through tunneling oxide layer (20) into floating gate (30). The threshold voltage of a stacked-gate transistor can be raised by means of such electron injection, and the device is then assumes a first state that reflect the content of the memory cell. On the other hand, during erasure of the memory cell, electrons are expelled from the source (15) through tunneling oxide layer (20) and out of floating gate (30) of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e., more electrons than were previously injected. This results in the formation of electron holes in the floating gate of the device. In severe cases, the stacked-gate transistor becomes a depletion transistor, which conducts even in the absence of the application of a control voltage at the control gate, (50). This phenomenon is known in the art as memory over-erasure.

To overcome the described memory over-erasure problem of stacked-gate type EEPROM devices, a split-gate EEPROM device is used as shown in FIG. 1b. This memory device comprises floating-gate transistor which similarly includes control gate (50'), floating gate (30') as in the case of the stacked-gate transistor of FIG. 1a. However, floating gate (30') here covers only a portion of the channel region, (17'), and the rest of the channel region, (19'), is directly controlled by control gate (50'). This split-gate-based memory cell is equivalent to a series connected floating-gate transistor (17') and an enhanced isolation transistor (19'), as is schematically represented in FIG. 1b. The principal advantage of such configuration is that isolation transistor (19') is free from influence of the state of floating gate (17') and remains in its off-state, even if floating-gate transistor (17') is subjected to the phenomenon of over-erasure and therefore, is in a conductive state. The memory cell can thus maintain its correct state irrespective of the over-erasure problem.

However, the greatest drawback of such split-gate design is the fact that a reduced number of program/erase cycles are allowed. This reduction is due to the fact that floating gate (30') of this split-gate memory cell configuration is only provided near the drain region (13'), which results in different mechanisms occurring for the programming and erasing operations of the device. That is, electron passage must be via a sequence of drain (13') and through tunneling oxide layer (20'), and the resulting reduction of allowable program/erase cycles renders the device suitable only for those applications requiring a relatively few number of program/erase cycles during the entire life span of the device.

To program the transistor shown in FIG. 1b, charge is transferred from substrate (10) through gate oxide (20') and is stored on floating gate (30') of the transistor. The amount of charge is set to one of two levels to indicate whether the cell has been programmed "on" of "off." "Reading" of the cell's state is accomplished by applying appropriate voltages to the cell source (15') and drain (13'), and to control gate (50'), and then sensing the amount of charge on floating gate (30'). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim (F-N) tunneling mentioned above. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of (F-N) tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Usually a thickness of between about 80 to 120 Angstroms is required to facilitate F-N tunneling.

The thicknesses of the various portions of the oxide layers on the split-gate side (between the control gate and the source) and the stacked-side (between the floating gate and the drain) of the memory cell of FIG. 1b play an important role in determining such parameters as current consumption, coupling ratio and the memory erase-write speed. In prior art, various methods have been developed to address these parameters. For example, in U.S. Pat. No. 5,592,002, Kanamori teaches the forming of a memory device having reduced current consumption. In his approach, a first oxide film is formed on the n-type impurity diffusion layer in a semiconductor substrate. A floating gate is next formed so as to be partially overlapped with the drain region through a second oxide film, and a control gate is formed thereon through a third oxide film and an insulating film. The thickness of the third oxide film is set to a value larger than the total thickness of the second oxide film and the insulating film to prevent occurrence of F-N tunnel action in a split gate region, and hence, achieve a reduction in current consumption.

Ahn of U.S. Pat. No. 5,716,865 also uses a thick insulation film between the tunneling region and the channel region in an EEPROM split-gate flash memory cell in order to prevent the degradation of the tunnel oxide film due to the band-to-band tunneling and the secondary hot carriers which are generated by a high electric field formed at the overlap regions between the junction region and the gate electrode when programming and erasure operations are performed with high voltage.

Hong, in U.S. Pat. No. 5,569,945 shows the forming of a stepped floating gate in an EPROM device whereby substantial gain in capacitive coupling is achieved by growing a thick, self-aligned oxide region below the control gate which in turn is separated from the opposing faces of the stepped floating gate. Hong also shows the forming of a split-gate flash memory cell with separated and self-aligned tunneling regions in U.S. Pat. No. 5,427,968.

The present invention discloses a different method of fabricating a split-gate memory device with improved data retention capacity and increased coupling ratio between the source and the floating gate of the memory cell.

SUMMARY OF THE INVENTION

It is therefore an object of this invention to provide a method of forming split-gate flash memories with improved data retention capacity.

It is another object of this invention to provide a method of forming split-gate flash memories with increased capacitive coupling between the source and the floating gate of the memory cell.

It is an overall object of this invention to provide a split-gate flash memory cell having reduced size, increased capacitive coupling and improved programmability.

These objects are accomplished by providing a silicon substrate having a plurality of active and field areas defined; forming a first gate oxide layer over said substrate; depositing a first nitride layer over said pad oxide layer; forming a first photoresist layer over said first layer of nitride; patterning said first photoresist layer to define cell area and source size; etching to pattern first nitride layer and said gate oxide layer correspondingly to cell area; removing said first photoresist layer from said substrate; forming a second gate oxide layer adjacent to said patterned oxide and nitride layers over cell areas on said substrate; forming a first polysilicon layer over said substrate; forming a second nitride layer over said first polysilicon layer; forming a second photoresist layer over said second nitride layer; patterning said second photoresist layer to define a floating gate region on said substrate; etching said second nitride layer through said patterning in said second photoresist layer and forming openings reaching said first polysilicon layer; performing ion implantation through openings in said second patterned photoresist mask to form source/drain regions within said substrate; removing said second photoresist layer; performing thermal oxidation of said first polysilicon layer exposed in said openings reaching said first polysilicon layer to form regions of poly-oxide; removing said second nitride layer; etching said first polysilicon layer using said regions of poly-oxide as a mask; growing inter-poly oxide over said first polysilicon layer; forming second polysilicon layer over said inter-poly oxide; and patterning said second polysilicon layer to form a control gate to complete the forming of said memory cell.

These objects are further accomplished by providing memory cell having appropriate gate oxide thicknesses between the substrate and the floating gate and between the floating gate and the control gate along with an additional thin nitride layer in order to overcome the problems of low data retention capacity of the floating gate and the reduced capacitive coupling between the floating gate and the source of prior art.

BRIEF DESCRIPTION OF THE DRAWINGS

FIG. 1a shows a stacked-gate type memory cell prior art.

FIG. 1b shows a split-gate type memory cell of prior art.

FIGS. 2a–2d show the steps of forming of a split-gate memory cell in the present manufacturing line.

FIG. 3a shows the forming of a thin gate oxide layer over a semiconductor substrate, according to this invention.

FIG. 3b shows the forming of an extra thin nitride layer over the substrate of FIG. 3a, according to the present invention.

FIG. 3c shows the patterning of the nitride/gate oxide of FIG. 3b over a cell region of this invention.

FIG. 3d shows the forming of a second gate oxide layer surrounding the nitride/oxide regions of the substrate of FIG. 3c.

DESCRIPTION OF THE PREFERRED EMBODIMENTS

Figures 3E, 3F:
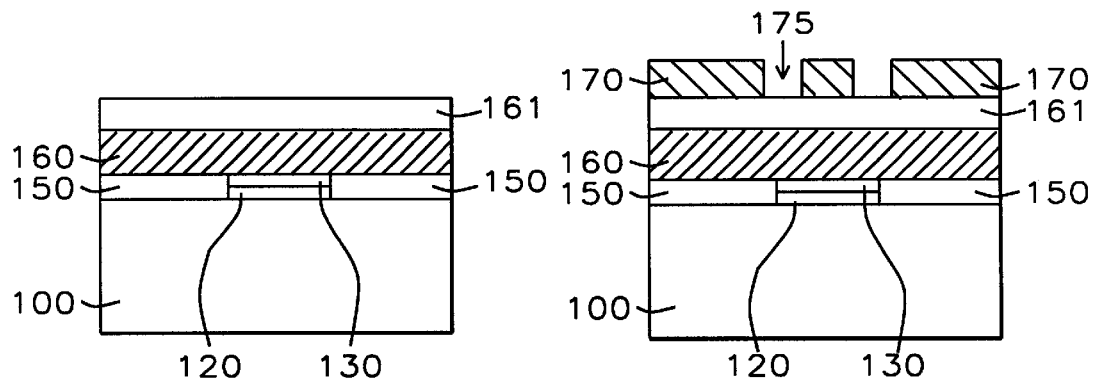
FIG. 3e shows the forming of a first polysilicon layer followed by a nitride layer over the substrate of FIG. 3e of this invention.
FIG. 3f shows the floating-gate patterning of a second photoresist layer after the forming of a first polysilicon layer and a second nitride layer of FIG. 3e of this invention.

Referring to the drawings, in FIGS. 2a–2d, it is general practice to form a split-gate flash memory cell by first growing gate oxide on a semiconductor substrate followed by the deposition of a first polysilicon layer and then a layer of silicon nitride. Usually, gate oxide layer (60) has a thickness of about 85 angstroms (Å), and first polysilicon (70) and nitride (80) layers have thicknesses of about 1200 and 800 Å, respectively, as shown in FIGS. 2a and 2b. After the deposition of silicon nitride layer, a first photoresist layer (90) is patterned to define floating gates and nitride is etched through pattern openings (95) in the photoresist layer until the underlying first polysilicon layer is reached. Then, cell implantation is performed to form source/drain regions, (11)/(13) as shown in FIG. 2c, and photoresist layer (90) is removed. Using nitride as a mask, first polysilicon layer (70) exposed in openings (95) in nitride layer (80) (not shown) is oxidized to form polyoxide (75) shown in FIG. 2c. Subsequently, nitride layer (80) is removed, and using poly-oxide (75) as a hard mask, first polysilicon layer is etched to form floating gates (77) shown in the same FIG. 2c. Once having formed the floating gates, an inter-polyoxide layer, (97) is formed over the substrate, and second polysilicon layer (not shown) is next deposited and patterned to form the control gate, (99), of the split-gate flash memory cell shown in FIG. 2d.

The split-gate flash memory cell of FIG. 2d, as practiced in the present manufacturing line, is found to exhibit relatively small capacitive coupling and low data retention capability. This is because, the relatively thick gate oxide (65) separating the floating gate from the substrate contributes to the reduced coupling ratio, and the so-called "smiling effect". The smiling effect is where the thickness of the outer edges or, "lips", of the gate oxide under the gate become thicker due to the diffusion of oxygen during the forming of the gate. Furthermore, the data retention capacity is also low. All of these effects are remedied by incorporating a much thinner gate oxide to improve coupling and an unusually thin nitride layer which is found to mitigate the "smiling effect", as well as gate oxide of appropriate thickness near the edge of the floating gate as disclosed below in the preferred embodiment of the present invention.

Next, as a main feature and key aspect of this invention, an additional thin nitride layer, (130) is formed over the already thin gate oxide layer as shown in FIG. 3b. The preferred thickness of nitride layer (130) is between about 50 to 60 Å, and can be formed by performing low pressure chemical vapor deposition (LPCVD) at a chamber pressure between about 0.25 to 1.0 torr, temperature between about 650° C. to 750° C. by reacting dichlorosilane ($SiCl_2H_2$) with ammonia ($NH_3$) with flow rates between about 80 to 120 standard cubic centimeters per minute (sccm).

Following the forming of first gate oxide layer (120), and additional thin layer (130), a first photoresist layer (140) is formed over the nitride layer and is patterned corresponding to the cell area to be formed. Both the already very thin gate oxide layer and the additional thin nitride layer are next dry etched to form a composite layer separating the floating gate to be formed from substrate (100) as shown in FIG. 3c. The first photoresist layer is removed using oxygen plasma ashing, as is practiced in the art.

As another feature and important aspect of the present invention, a second gate oxide layer, (150), is grown surrounding the cell areas covered with composite first gate oxide/ additional thin nitride as shown In FIG. 3d. The preferred thickness of second gate oxide layer (150) is between about 80 to 85 Å, and can be grown at a temperature between about 850 to 950 C. This is followed by forming the first polysilicon layer, (160), over the second gate oxide layer and the additional thin/first gate oxide composite layer covering cell area regions by LPCVD at a temperature between about 550 to 650 C. using silicon source $SiH_4$. The preferred thickness of the first polysilicon layer is between about 1100 to 1200 Å. A second nitride layer, with a preferred thickness of between about 750 to 850 Å, is next formed over the first polysilicon layer by using low pressure chemical vapor deposition (LPCVD) at a temperature between about 750 to 850° C. by reacting dichlorosilane ($SiCl_2H_2$) with ammonia ($NH_3$). First polysilicon layer (160) and second nitride layer (161) are shown in FIG. 3e.

A second photoresist layer, (170), is next formed and patterned to define the floating gate regions over the substrate as shown in FIG. 3f. The pattern openings,(175), are dry etched into the second nitride layer until the underlying polysilicon layer (160) is exposed. Next, cell implantation is accomplished, preferably, by using boron gas at a dosage level between about $1 \times 10^{12}$ to $3 \times 10^{12}$ atoms/cm$^2$ with energy level between about 50 to 75 KeV the ion implantation. The formed source and drain regions are shown with reference numerals (111) and (113), respectively, in FIGS. 3h and 3i. Subsequently, the second photoresist layer is removed as shown in FIG. 3f by using conventional oxygen ashing process.

Figures 3G, 3H:
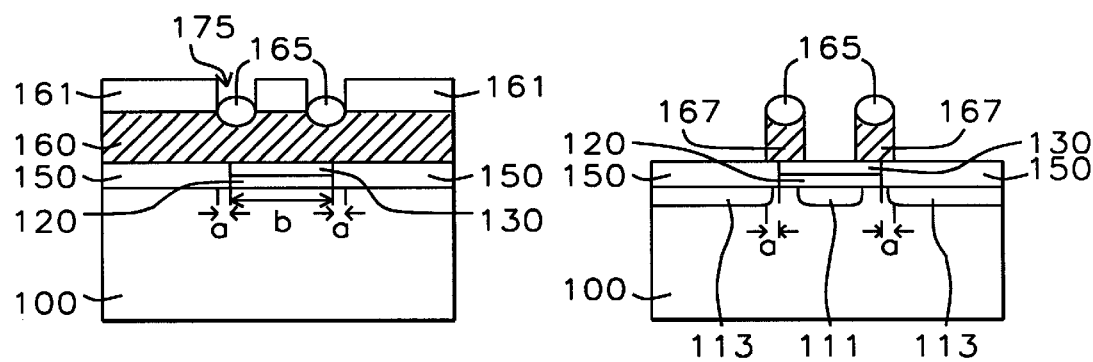
FIG. 3g shows the oxidation of the first polysilicon layer exposed in floating-gate pattern openings formed in the second nitride layer, according to this invention.
FIG. 3h shows the forming of source/drain regions in the substrate of FIG. 3g, along with the forming of floating-gates of this invention by etching the first polysilicon layer using the poly-oxide regions as a hard mask, according to this invention.

It is critical that the floating gate pattern (175) shown in FIG. 3f has the appropriate overlap (a) shown in FIG. 3g. This is because, the gate oxide at the programming edge area of the floating gate to be formed should not be too thin to cause low data retention capacity. At the same time, the larger spanning gate oxide area (b) between the substrate and the floating gate should not be too thick to cause reduced coupling between the source and the floating gate. Hence, by using a first thin gate oxide layer of thickness between about 50 to 55 Å in the larger area (b) the former problem of reduced coupling is alleviated, while by using the second gate oxide layer of thickness between about 80 to 85 Å at the corners (a) only, the problem of low data retention is circumvented. In addition, the problem of "smiling effect" is avoided with the use of the extra thin nitride layer in conjunction with the first thin gate oxide layer. Thus, in order to achieve the proper thicknesses of gate oxide, it is preferred that the floating gate is partially disposed edgewise on a portion of said second gate oxide layer not exceeding half the width of said floating gate.

The exposed first polysilicon layer in the floating gate pattern openings in the second nitride layer are next oxidized in a wet environment and at a temperature between about 850 to 950° C. to form poly-oxide "caps" (165) shown in FIG. 3h, with a preferred thickness between about 1400 to 1500 Å. After the poly oxidation, the second nitride layer is removed by applying a wet solution of phosphoric acid, $H_3PO_4$. Using the poly-oxide layer as a hard mask, the first polysilicon layer is etched using a recipe comprising HBr, $Cl_2$ gases thus forming polysilicon floating gates (167) as shown in FIG. 3h.

Figure 3I:
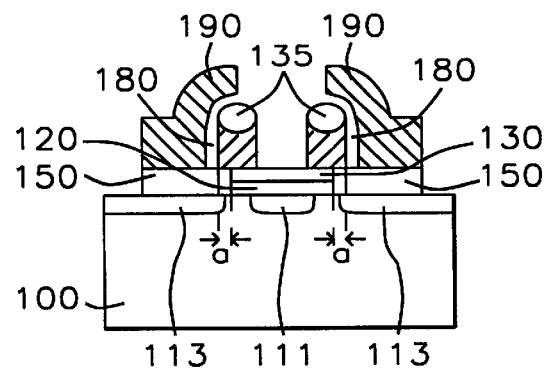
FIG. 3i shows the completion of the split-gate flash memory cell of this invention with the forming of the interpoly oxide and the control gate, according to this invention.

The penultimate step of completing the forming of the split-gate memory cell structure is accomplished first by forming an inter-poly oxide (180) as shown in FIG. 3i. It is preferred that layer (180) is an oxide with a thickness between about 200 to 300 Å. At the final step, a second polysilicon layer is deposited over inter-poly oxide (180) and is patterned to form the control gate, (190), as shown in the same FIG. 3i. It is preferred that the second polysilicon layer is formed using silicon source SiH$_4$ in an LPCVD chamber at a temperature between about 550 to 620°C., and that it has a thickness between about 1500 to 2500 Å.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, for shrinking cell size by forming multiple gates sharing the same source as shown in FIG. 3*i*.

That is to say, while the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell with an additional thin nitride layer and improved coupling ratio comprising:

a substrate having active and field regions defined;

an additional thin nitride layer disposed over a thinner first gate oxide layer;

patterning said additional thin nitride layer and said first gate oxide layer over cell area in said substrate;

a second gate oxide layer formed adjacent to said additional thin nitride layer surrounding said cell area;

a floating gate partially disposed edgewise on portion of said second gate oxide layer, and substantially over said additional thin nitride layer over said first gate oxide layer; and a control gate over said floating gate.

2. The split-gate memory cell of claim 1, wherein said first gate oxide layer has a thickness between about 50 to 55 angstroms (Å).

3. The split-gate memory cell of claim 1, wherein the thickness of said additional thin nitride layer is between about 50 to 60 Å.

4. The method of claim 1, wherein said second gate oxide layer has a thickness between about 80 to 85 angstroms (Å).

5. The split-gate memory cell of claim 1, wherein said floating gate is partially disposed edgewise on a portion of said second gate oxide layer not exceeding half the width of said floating gate.

* * * * *

UNITED STATES PATENT AND TRADEMARK OFFICE
CERTIFICATE OF CORRECTION

PATENT NO. : 6,326,660 B1 Page 1 of 1
DATED : December 4, 2001
INVENTOR(S) : Yai-Fen Lin, Chia-Ta Hsieh, Hung-Cheng Sung, Chuang-Ke Yeh and Di-Son Kuo It is certified that error appears in the above-identified patent and that said Letters Patent is hereby corrected as shown below:

<u>Title page,</u>
Item [74], delete "Sergin Oktay" and replace with -- Sevgin Oktay --.

Signed and Sealed this

Fourth Day of June, 2002

*Attest:*

JAMES E. ROGAN
*Attesting Officer* *Director of the United States Patent and Trademark Office*